(12) United States Patent
Vereecken et al.

(10) Patent No.: US 8,148,188 B2
(45) Date of Patent: Apr. 3, 2012

(54) PHOTOELECTROCHEMICAL CELL WITH CARBON NANOTUBE-FUNCTIONALIZED SEMICONDUCTOR ELECTRODE

(75) Inventors: Philippe M. Vereecken, Liège (BE); Rufi Kurstjens, Roeselare (BE); Ainhoa Romo Negreira, Leuven (BE); Daire J. Cott, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 12/392,831

(22) Filed: Feb. 25, 2009

(65) Prior Publication Data

US 2009/0215276 A1 Aug. 27, 2009

Related U.S. Application Data

(60) Provisional application No. 61/031,553, filed on Feb. 26, 2008.

(51) Int. Cl.
*H01L 21/00* (2006.01)
(52) U.S. Cl. .... 438/57; 438/597; 438/478; 257/E21.001
(58) Field of Classification Search ............. 438/48, 438/57, 584, 586, 597, 602–604, 660, 478
See application file for complete search history.

(56) References Cited

U.S. PATENT DOCUMENTS

| | | | | |
|---|---|---|---|---|
| 6,743,408 B2 * | 6/2004 | Lieber et al. | ............... | 423/447.1 |
| 6,759,349 B2 | 7/2004 | Lewis et al. | | |
| 7,560,366 B1 * | 7/2009 | Romano et al. | ............... | 438/503 |
| 7,582,507 B2 * | 9/2009 | Hongo | ............................. | 438/99 |
| 7,718,531 B2 * | 5/2010 | Radisic et al. | ................ | 438/678 |
| 2002/0055239 A1 * | 5/2002 | Tuominen et al. | ............ | 438/466 |
| 2002/0158342 A1 * | 10/2002 | Tuominen et al. | ............ | 257/784 |
| 2002/0167375 A1 * | 11/2002 | Hoppe et al. | ................... | 333/186 |
| 2004/0067602 A1 * | 4/2004 | Jin | ................................... | 438/22 |
| 2005/0232844 A1 * | 10/2005 | Diner et al. | ................ | 423/447.2 |
| 2006/0066202 A1 * | 3/2006 | Manohara et al. | ............ | 313/311 |
| 2006/0194058 A1 * | 8/2006 | Amlani et al. | ................ | 428/408 |
| 2006/0212974 A1 * | 9/2006 | Kawabata et al. | ............ | 977/742 |
| 2006/0240218 A1 * | 10/2006 | Parce | .............................. | 428/98 |
| 2007/0109837 A1 * | 5/2007 | Kurt et al. | ...................... | 365/156 |
| 2007/0148962 A1 * | 6/2007 | Kauppinen et al. | ........... | 438/637 |
| 2008/0062824 A1 * | 3/2008 | Hendriks et al. | ........... | 369/44.14 |
| 2008/0093698 A1 * | 4/2008 | Tsakalakos et al. | .......... | 257/499 |
| 2010/0029063 A1 * | 2/2010 | Gambin et al. | ................ | 438/478 |
| 2010/0096618 A1 * | 4/2010 | Iacopi et al. | ..................... | 257/14 |
| 2010/0303675 A1 * | 12/2010 | Suekane et al. | ............... | 422/129 |

OTHER PUBLICATIONS

Brown et al., Analytical Chemistry, vol. 64, p. 427, (1992).
Seo et al., "Cathodic decomposition and anodic dissolution and changes in surface morphology of n-type InP in HCl", Journal of the Electrochemical Society, vol. 148, Issue 10, pp. B400-B404 (2001).
Strubbe et al., "The effect of high LiCl concentrations upon the competition between anodic decomposition and stabilization of n-GaAs/$Fe^{2+}$ electrode", Journal of Electroanalytical Chemistry, vol. 249, Issue 1-2, pp. 429-44 (1993). Chiodarelli et al., "Integration of Vertical Carbon Nanotube Bundles for Interconnects," Journal of the Electrochemical Society, 157 (10) K211-K217 (2010).

* cited by examiner

*Primary Examiner* — Savitr Mulpuri
(74) *Attorney, Agent, or Firm* — Knobbe Martens Olson & Bear LLP

(57) ABSTRACT

Photoelectrochemical cells and methods are provided, in particular, to the functionalization of semiconductor surfaces such that its semiconducting and light generating properties are maintained and the surface becomes stable in wet environments. In particular the preferred embodiments relate to unstable semiconductor materials which have photocurrent generating properties, and to methods for the functionalization of surfaces with metallic carbon nanotubes (CNTs).

38 Claims, 15 Drawing Sheets

Different structures of CNT functionalized semiconductors

Examples of blanket CNT mat and patterned CNT patches on n-type Si semiconductor substrate Setup used for 2- and 3-electrode photoelectrochemical cell Fabrication of the CNT - functionalized semiconductor electrode Dense CNT layers according to the invention with different thicknesses.

PHOTOELECTROCHEMICAL CELL WITH CARBON NANOTUBE-FUNCTIONALIZED SEMICONDUCTOR ELECTRODE

CROSS-REFERENCE TO RELATED APPLICATION

This application claims the benefit under 35 U.S.C. §119 (e) of U.S. provisional application Ser. No. 61/031,553, filed Feb. 26, 2008, the disclosure of which is hereby expressly incorporated by reference in its entirety and is hereby expressly made a portion of this application.

FIELD OF THE INVENTION

Photoelectrochemical cells and methods are provided, in particular, to the functionalization of semiconductor surfaces such that its semiconducting and light generating properties are maintained and the surface becomes stable in wet environments. In particular the preferred embodiments relate to unstable semiconductor materials which have photocurrent generating properties, and to methods for the functionalization of surfaces with metallic carbon nanotubes (CNTs). The preferred embodiments enable the use of electrochemical cells with electrode materials which hereto could not be used because the electrode material is unstable under normal circumstances and the surface is prone to oxidation, passivation or decomposition. A stack of a semiconductor layer with a dense CNT layer on top is provided. The CNT functionalized semiconductor electrode structure still has the photo-generating properties of the semiconductor layer, whereas the electrochemical reaction occurs at the CNT. This combination enables the use of unstable semiconductor materials such as Si, Ge and III-V semiconductors in wet electrochemical cells. The semiconductor-CNT electrodes can be used as photo-anodes (n-type semiconductor) or photo-cathodes (p-type semiconductor) in photo-electrochemical cells such as photovoltaic cells or as photosensing electrodes in electrochemical sensors. The electrodes can also be used without light where opportune. In the dark, semiconductor-CNT electrodes can be used as electrochemical Schottky diodes. In general, the method of preferred embodiments can be used for the functionalization of electrode surfaces of unstable electrode material such that some specific properties of the electrode material are maintained. CNT functionalized or semiconductor/CNT electrodes for photo-electrochemical cells are provided, along with the method of fabrication, as well as its application in photovoltaic cells, photo-electrochemical detectors and photoelectrochemical sensors. The method can be extended to all unstable electrode materials which have specific properties which can otherwise not be exploited.

BACKGROUND OF THE INVENTION

Photo-electrochemical cells consist of a semiconductor electrode immersed into a suitable redox electrolyte together with a reversible metal electrode. Upon illumination the holes and electrons generated by the incident photons are separated by the potential difference over the depletion layer and react with the redox couple in the electrolyte. A schematic of the working of such cells is shown in FIG. 1. For example, in case of an n-type semiconductor, the photo-holes move to the surface where they react with a reducing agent (e.g. Fe$(CN)_6^{4-}$+h$^+$→Fe$(CN)_6^{3-}$). The electrons move through the external electrical circuit towards the reversible counter electrode (e.g. Pt), where they reduce the oxidizing agent (e.g. Fe$(CN)_6^{4-}$+e-→Fe$(CN)_6^{4-}$). In this way, the light energy is converted into electrical energy and since the redox system is reversible, the cell can in principle go on forever.

Photo-electrochemical cells form components of several devices, such as sensor devices, solar-energy devices, and detection devices and of chemical installations for synthesis and electrocatalysis such as electrolysis. The structures of preferred embodiments be used as an electrochemical cell component for all above applications, with adjustments and additions as necessary. An example of photoelectrochemical cell for solar-energy conversion is the n-type Si semiconductor functionalized with CNT carpet as described in this patent and used as the photo-anode in a cell with an inert platinum electrode, more particularly a transparent ITO electrode functionalized with platinum particles, and an electrolyte with a stable redox couple such as Fe$^{3+}$/Fe$^{2+}$, preferably in a complexed form such as the iron(III)hexacyanoferrate (Fe$(CN)_6^{3-}$)/iron(II)hexacyanoferrate (Fe$(CN)_6^{4-}$) redox couple. An example of a device for photo-electrochemical detection is a device for detection of separated species coming from an HPLC column [e.g. photo-electrochemical detection at a TiO2 wire by G. N. Brown, J. W. Birks, C. A. Coval, in Analytical Chemistry, Volume 64, page 427, published in 1992]. An example of a sensor device could be for the photo-electrochemical detection of enzymes or proteins in biological samples. Here, both the photocurrent and photovoltage could be used as detection signals. For the sensor application, it may be necessary to further functionalize the CNT which are on the semiconductor surface so that the photoelectrochemical cell becomes selective to certain molecules.

Semiconductor materials and especially low band-gap semiconductor materials such as Si, Ge and III-V materials are unstable in wet environment, aqueous and non-aqueous, especially under current flow. Silicon easily forms an oxide in the presence of water. When using Si as an anode for electro-oxidation reactions, silicon itself will oxidize and form an insulating or passivating layer, shutting down the electrochemical reactions as shown schematically in FIG. 2. Germanium and III-V semiconductors with Ga, In and Al as III-elements and As, Sb and P as V-elements (e.g. GaAs, InP, InSb, GaSb, GaP, InAs, Al$_x$Ga$_y$As, In$_x$Ga$_y$As and other ternary and quaternary combinations) are unstable in electrolyte solutions and will decompose under current flow. Under anodic current, the semiconductor itself will be electro-etched and the semiconductor material will dissolve. Also under cathodic current flow electrode decomposition can occur (e.g. "Cathodic decomposition and anodic dissolution and changes in surface morphology of n-type InP in HCl" by M. Seo, M. Aihara, A. W. Hassel; in JOURNAL OF THE ELECTROCHEMICALSOCIETY Volume: 148 Issue: 10 Pages: B400-B404 Published: October 2001). The severity of the electro-dissolution is dependent on solution composition and the presence of stabilizing agents [e.g. "The effect of high LiCl concentrations upon the competition between anodic decomposition and stabilization of n-GaAs/Fe$^{2+}$ electrode", by K. Strubbe and W. P. Gomes, in JOURNAL OF ELECTROANALYTICAL CHEMISTRY Volume: 349 Issue: 1-2 Pages: 429-441 Published: Apr. 30, 1993]. The stabilizing agents are for example suitable reducing agents which will compete with the electro-etching reaction and thus slow down the electrode decomposition kinetics. These stabilizing agents can however not prevent decomposition completely and the electrode will always be slowly consumed.

The use of silicon in photoelectrochemical cells (e.g. electrochemical sensors or solar cells) is of interest because of the suitable band gap of 1.12 eV and because of its widespread availability and supporting technologies. The surface of silicon is very chemically active though and will easily react with water or oxygen, forming an insulating oxide. This oxide on the surface can impede the characteristics of the silicon. Performances of electrochemical cells based on silicon electrodes will hence gradually deteriorate over time due to oxide growth.

FIG. 3 shows an example of the electrochemical response (current-voltage curves) for a Si photoanode in an electrolyte solution with $Fe(CN)_6^{3-}/Fe(CN)_6^{4-}$ as a suitable redox couple: In the first voltage scan towards positive potentials an anodic photo-current plateau is measured for the oxidation of $Fe(CN)_6^{4-}$ (valence of +II) to $Fe(CN)_6^{3-}$ (valence of +III). Already in the reverse scan (back towards more negative potentials), the current-voltage curve (i-V curve) has shifted towards more positive potentials due to the oxidation of the silicon surface, showing that not all the photo current was used for the oxidation of the reducing agent only. The current-voltage behaviour deteriorates even more upon subsequent scans as the i-V curves shift towards more positive voltage values upon each scan. Also the cathodic currents deteriorate as the oxide also hinders the reduction reactions.

Even in organic media, small amounts of water present will eventually passivate the surface. This is illustrated in FIG. 4 where the current-voltage characteristics of an n-type Si photo-anode are shown in acetonitrile medium. The Si surface slowly deteriorates in the acetonitrile solution upon several scans for photo-anodization of the $I^-$ ions to form $I_2$. The oxidation of Si is sped up drastically by the addition of small amounts of water to the organic acetonitrile solution.

Therefore there is a need to stabilize Si electrode surfaces such that oxidation (anodization) is avoided (eliminated), especially when working in aqueous media.

A typical way of forming a clean silicon surface is to use wet chemical etching with HF(aq.), resulting in a hydrogen-terminated Si surface. This surface is electrically suitable when initially formed. However, this surface readily oxidizes in air or in water-containing ambients. That overlayer can impede the semiconductor characteristics. For example, this can impede photocurrent flow through an electrochemical cell.

Previous art has suggested coating the surface of Si electrodes with islands or films of metal. This process creates buried Si/metal junctions on protected regions of the electrode which is to be avoided.

U.S. Pat. No. 6,759,349 stabilizes silicon surfaces by depositing a self assembled monolayer (SAM) onto the silicon surface, whereby the SAM layer contains derivatives with covalently-attached alkyl chains used to protect the surface. A preferred mode uses a halogenation/alkylation procedure in which the surface is treated with a halogen, e.g., chlorine, and then an alkyl-containing material. The problem however with these SAM layers is the fact that these layers have a negative impact on the conductivity. Furthermore these SAM layers tend to deteriorate in time or released from the Si-surface.

Another solution proposed in the prior art methods and one of the straightforward approaches is to avoid oxide growth by using a non-aqueous electrolyte in combination with a redox couple, instead of an aqueous electrolyte with redox couple. However, the organic solvent will not be absolutely free of water even after treatment with drying agents or conditions which means that the problem is not solved.

SUMMARY OF THE INVENTION

In a first aspect, a method is provided for functionalizing semiconductor surfaces, the method comprising: providing at least one catalyst particle on a semiconductor surface; and thereafter using the catalyst particle to form at least one carbon nanostructure on the semiconductor surface, whereby a carbon nanostructure-functionalized semiconductor surface is obtained.

In an embodiment of the first aspect, the at least one catalyst particle is provided by electrodeposition.

In an embodiment of the first aspect, the at least one catalyst particle is provided by chemical vapor deposition.

In an embodiment of the first aspect, the at least one catalyst particle is grown using a growth technique using a carbon gas source.

In an embodiment of the first aspect, the carbon gas source is $C_2H_4$ and wherein the growth technique uses at least one of an $H_2$ assistant gas and an $N_2$ assistant gas.

In an embodiment of the first aspect, the carbon nanostructure-functionalized semiconductor surface is an electrode in a stable photoelectrochemical cell.

In an embodiment of the first aspect, the semiconductor surface is that of a semiconductor substrate, wherein the at least one carbon nanostructure protects the semiconductor surface, and wherein the semiconductor substrate is a stable electrode for a photoelectrochemical sensor.

In an embodiment of the first aspect, the semiconductor surface is that of a semiconductor substrate, wherein the at least one carbon nanostructure protects the semiconductor surface, and wherein the semiconductor substrate is a stable electrode for a photoelectrochemical solar cell.

In an embodiment of the first aspect, the semiconductor surface is that of a semiconductor substrate, wherein the at least one carbon nanostructure protects the semiconductor surface, and wherein the semiconductor substrate is a stable electrode for a photoelectrochemical detector.

In an embodiment of the first aspect, the semiconductor surface is that of a semiconductor substrate, wherein the at least one carbon nanostructure protects the semiconductor surface, and wherein the semiconductor substrate is a stable electrode for photoelectrochemical synthesis.

In an embodiment of the first aspect, the carbon nanostructures are from about 1 nm to 100 nm in diameter, and wherein the catalyst particles comprise at least one metal selected from the group consisting of nickel, cobalt, iron, mixtures thereof, and alloys thereof with at least one metal selected from the group consisting of tungsten, vanadium, and molybdenum.

In an embodiment of the first aspect, the at least one carbon nanostructure forms a hydrophobic protection barrier configured to keep electrolyte and water away from the semiconductor surface; and whereby metallic conduction paths are created through a passivation oxide layer that is on the semiconductor surface.

In an embodiment of the first aspect, a dense mat of straight and aligned carbon nanotubes is formed, and wherein a density of the carbon nanostructures on the semiconductor surface is from about $10^{10}$ tubes per $cm^2$ to about $10^{13}$ tubes per $cm^2$. The semiconductor substrate can be a stable electrode for a photoelectrochemical device configured for back-side illumination of the dense mat.

In an embodiment of the first aspect, a dense mat of curled and twisted carbon nanotubes is formed, and wherein a density of the carbon nanostructures on the semiconductor surface is from about $10^8$ tubes per $cm^2$ to about $10^{11}$ tubes per $cm^2$. The semiconductor substrate can be a stable electrode for a photoelectrochemical device configured for back-side illumination of the dense mat.

In an embodiment of the first aspect, a sparse and separated layer of carbon nanotubes is formed, and wherein a passivation oxide forms in areas of the semiconductor surface between carbon nanotubes. The semiconductor substrate can be a stable electrode for a photoelectrochemical device configured for front-side illumination of the sparse and separated layer of carbon nanotubes.

In an embodiment of the first aspect, the step of providing at least one catalyst particle comprises spin coating or drop casting a colloidal solution of catalyst nanoparticles on the semiconductor surface.

In an embodiment of the first aspect, the step of providing at least one catalyst particle comprises: spin coating or drop casting a solution comprising a metal ion in a solvent on the semiconductor surface; removing the solvent; and sintering in a reducing atmosphere at a temperature of from about 600° C. to about 900° C. for less than 1 minute, whereby catalyst particles are formed.

DETAILED DESCRIPTION OF THE DRAWINGS

All drawings are intended to illustrate some aspects and preferred embodiments. Not all alternatives and options are shown and therefore the invention is not limited to the content of the given drawings.

FIG. 1 depicts the principle of a prior art photo-electrochemical cell. Photons from the incident light generate electron-hole pairs which are separated by the electric field in the space-charge layer of semiconductor. The holes are driven to the surface of the semiconductor or the semiconductor/electrolyte interface where they are scavenged by the reducing species, Red, transforming it to its oxidized form, Ox. The oxidizing species, Ox, are reduced again at the reversible counter electrode (e.g. Pt).

FIG. 2 depicts passivation of a silicon surface. The oxidation of the silicon surface forms a passivation oxide layer which impedes electrochemical reactions thus making it unsuitable for photo-electrochemical cells.

FIG. 3 depicts the photo-electrochemical response of n-type Si electrode in aqueous solution. Three-electrode measurements with n-type Si semiconductor electrode under white light illumination, a Pt mesh as a counter electrode and Pt wire in Luggin capillary as reference electrode are depicted. The solution is 0.35M $K_4Fe(CN)_6$, 0.05M $K_3Fe(CN)_6$, 0.2M KCl in water. Strong deterioration of the photo-electrochemical response was observed after four scans, as the bare Si anode oxidizes quickly in aqueous medium even in the presence of a large amount of $K_4Fe(CN)_6$ as the reducing species and stabiliser.

Figure 6B:
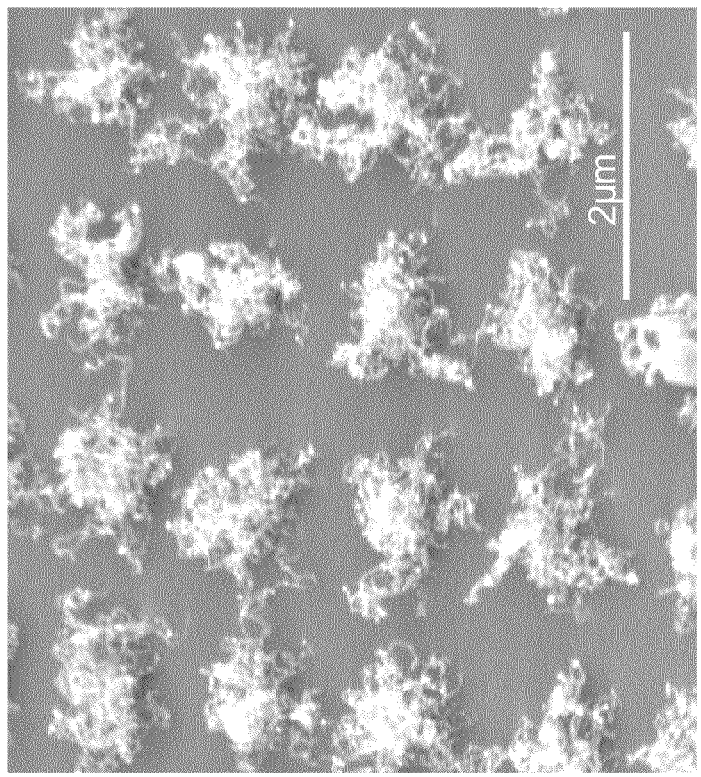
Figure 6A:
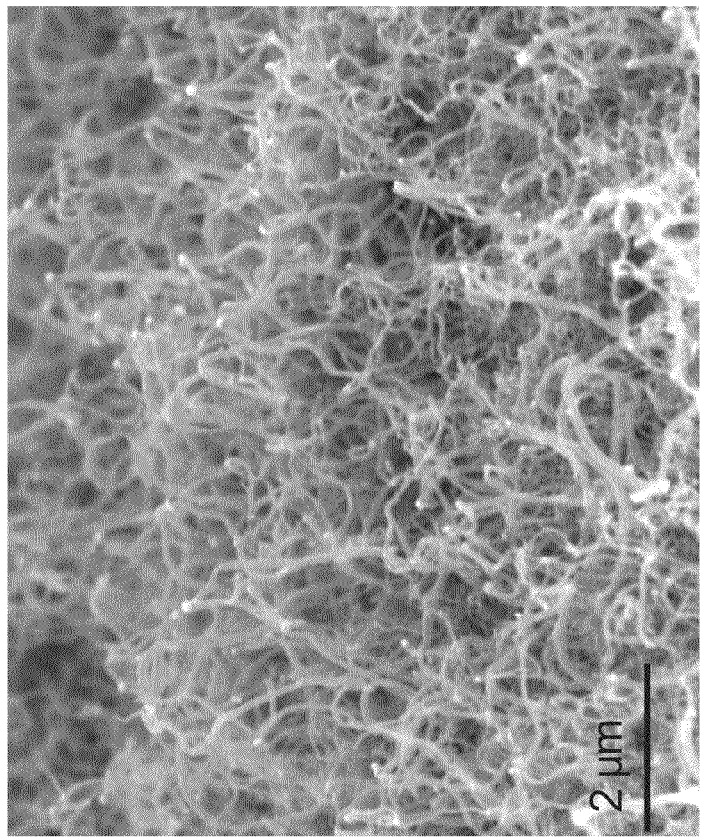

FIG. 6 depicts examples of blanket CNT mat and patterned CNT patches on n-type Si semiconductor substrate. FIG. 6(a) is a SEM image of entangled carbon nanotubes grown from electrochemically deposited Ni particles (−1.5V vs. Ag/AgCl for 2 s, steady-state current density of 100 mA/cm$^2$) in a thermal CVD reactor; and FIG. 6(b) is a SEM images (45° tilt) of CNT grown selectively out of 300 nm patterned holes in 300 nm thick $SiO_2$ on the Si substrate from electrodeposited Ni nanoparticles (−7 mA·cm$^{-2}$ for 0.2 s). The tubes are approximately 20 nm in diameter. CNT growth was carried out in a catalytic chemical-vapor deposition (CCVD) horizontal-flow reactor using $C_2H_4$ as the carbon source at atmospheric pressure. The substrates were first heated to 700° C. in a $N_2$ atmosphere (1 l·min-1 $N_2$ flow) for 3 minutes and then CNT growth was started by the introduction of a mixture of $H_2/C_2H_4$. Specifically, blanket substrates were exposed to a mixture of $H_2/C_2H_4$ (flow ratio of 0.5/0.1 l·min-1) for 5 minutes. CNT growth on patterned substrates was achieved using a flow of 0.5/0.5 l·min-1 for 1 minute, unless otherwise noted.

Figure 7:
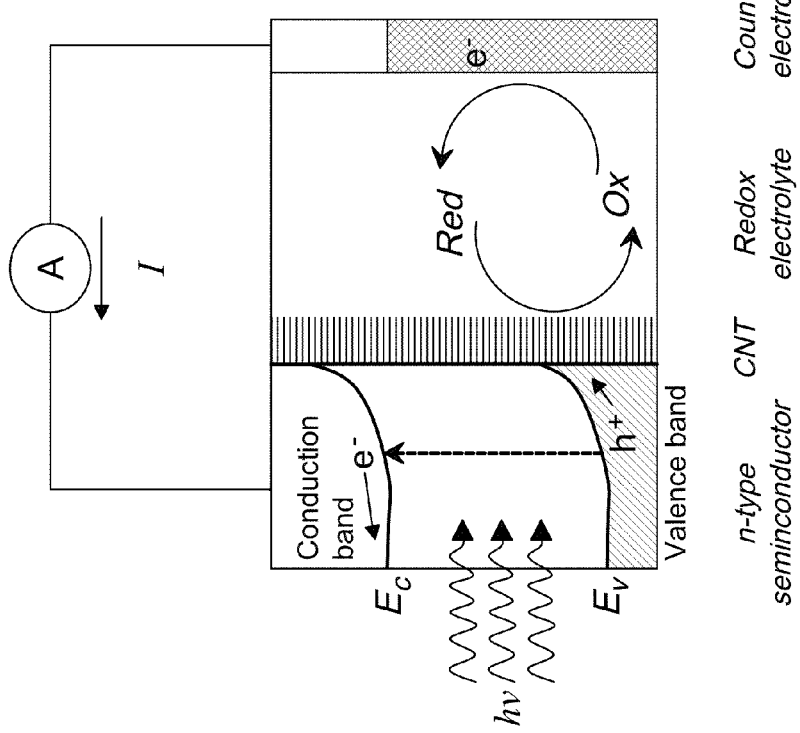

FIG. 7 depicts the working principle of photoelectrochemical cell with a CNT functionalized semiconductor electrode. Photons from the incident light generate electron-hole pairs in the semiconductor which are separated by the electric field in the space-charge layer of semiconductor. The holes are driven to the surface of the semiconductor and transferred to the conductive CNT. The electrochemical reaction (oxidation of the reducing agent, Red, in solution transforming it to its oxidized form Ox) now proceeds at the CNT/electrolyte interface. The oxidizing species, Ox, are reduced main at the reversible counter electrode (e.g. Pt).

FIG. 8 depicts a setup used for 2- and 3-electrode photoelectrochemical cells.

Figure 9:
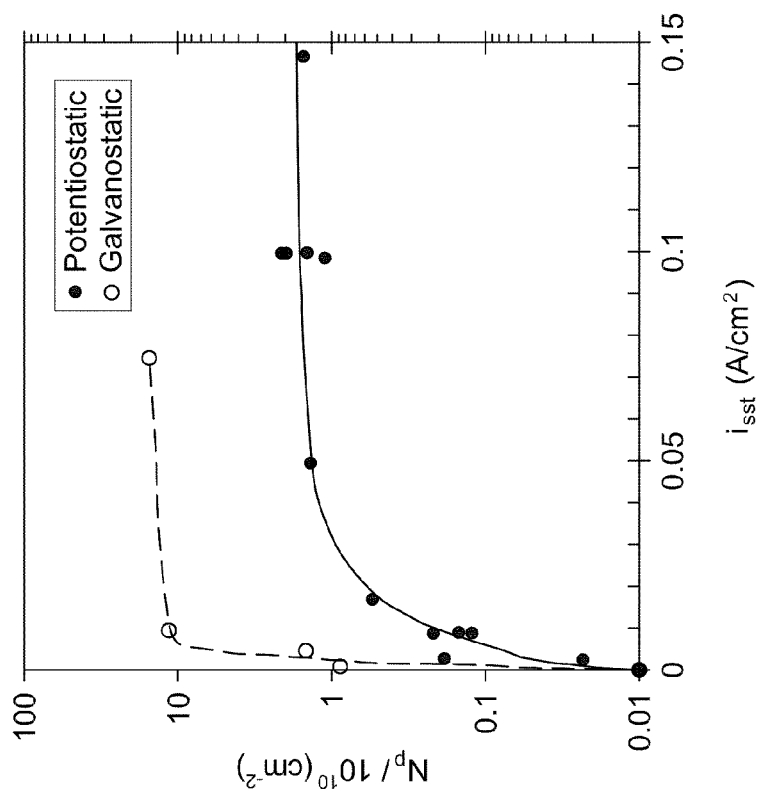

FIG. 9 depicts electrochemical deposition of Ni nanoparticles. Particle density is depicted as a function of steady-state current density for electrochemical deposition under potentiostatic (constant voltage or potential) and galvanostatic mode (constant current) on n-type Si (100) in aqueous solution with 0.01M Ni $(NO_3)_2$, 1M NaCl and 1M $NH_4Cl$ and the pH was adjusted to 8.3 with $NH_4OH$.

Figure 10A:
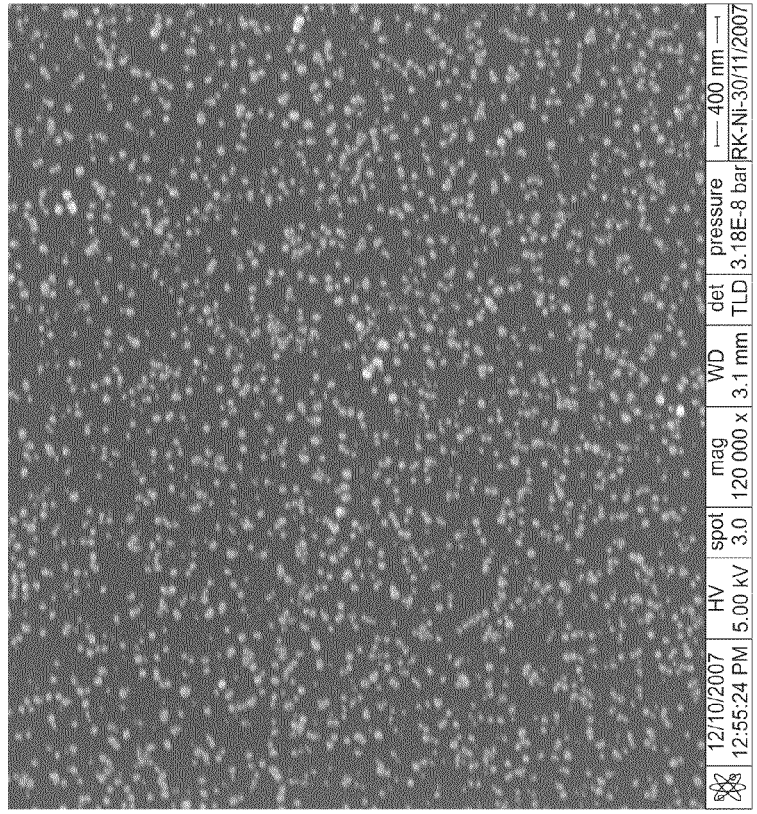
Figure 10B:
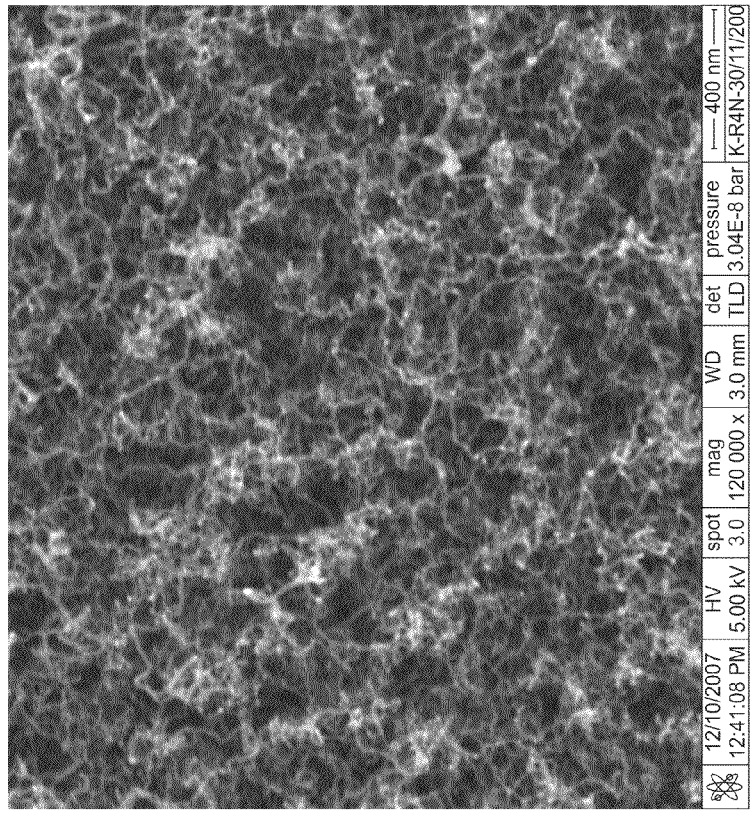

FIG. 10 depicts fabrication of a CNT-functionalized semiconductor electrode. FIG. 10(a) shows Ni catalyst placement by electrodeposition under potentiostatic mode, particle density: $2.5 \times 10^{10}$ particles/cm$^2$ with particle of around 20 nm in diameter for steady-state current density of 60 mA/cm$^2$ for 0.6 s of deposition; and FIG. 10(b) is an example of CNT growth with high density Ni particles as in (a) after thermal CVD growth at 750-820° C. with acetylene (C2H4) as carbon precursor gas.

Figure 11B:
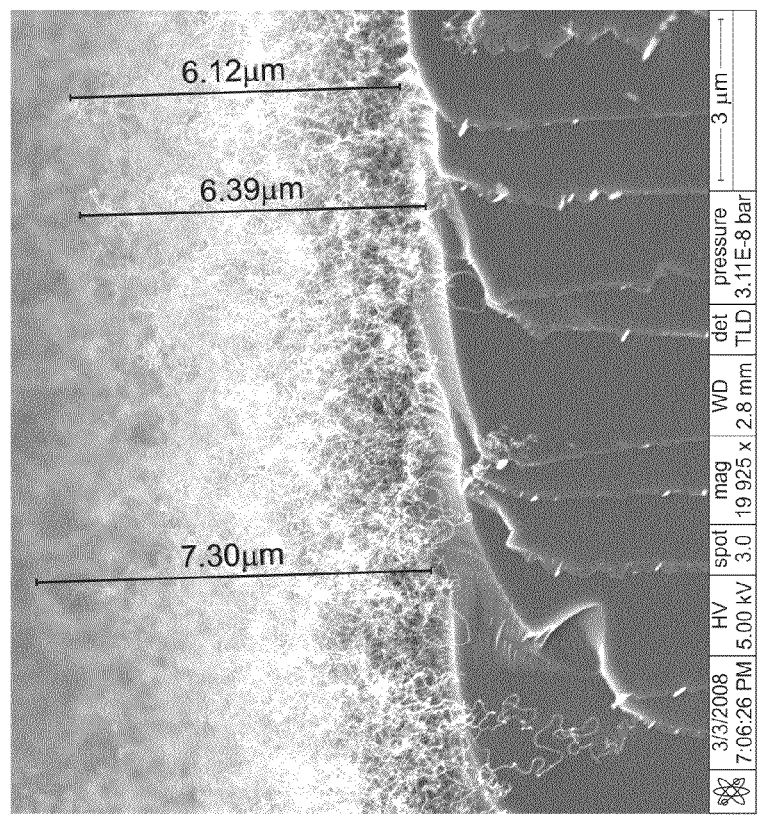
Figure 11A:
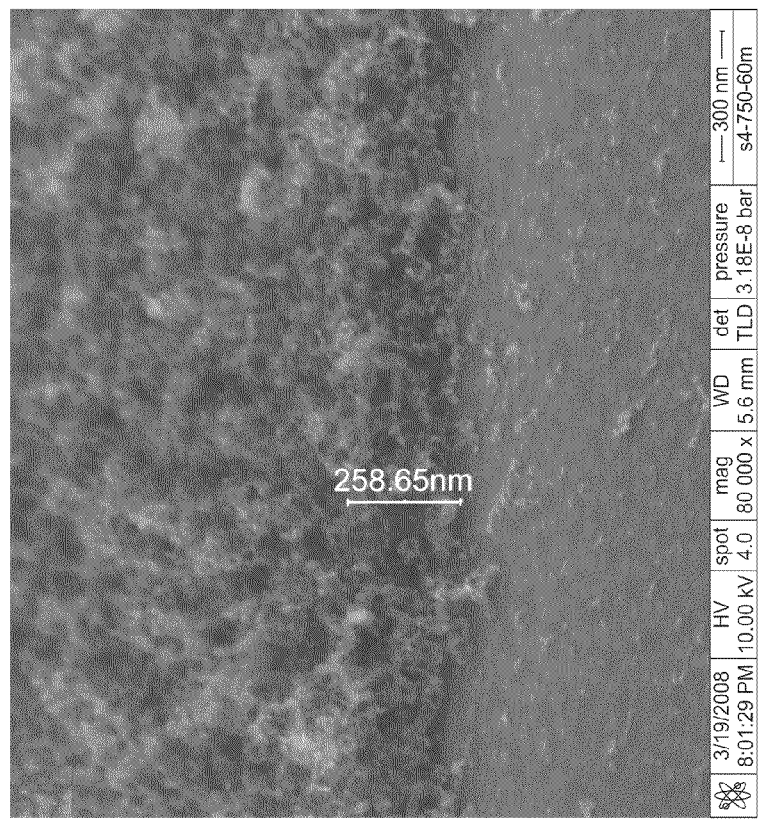

FIG. 11 depicts dense CNT layers according to the preferred embodiments with different thicknesses. A cross-section of CNT layers with entangled CNT grown on n-type Si from electrodeposited Ni particles with thickness of 6 to 7 micron is shown in FIG. 11(a). A cross-section of CNT layers with entangled CNT grown on n-type Si from electrodeposited Ni particles with thickness of 250 nm is shown in FIG. 11(b).

Figure 12:
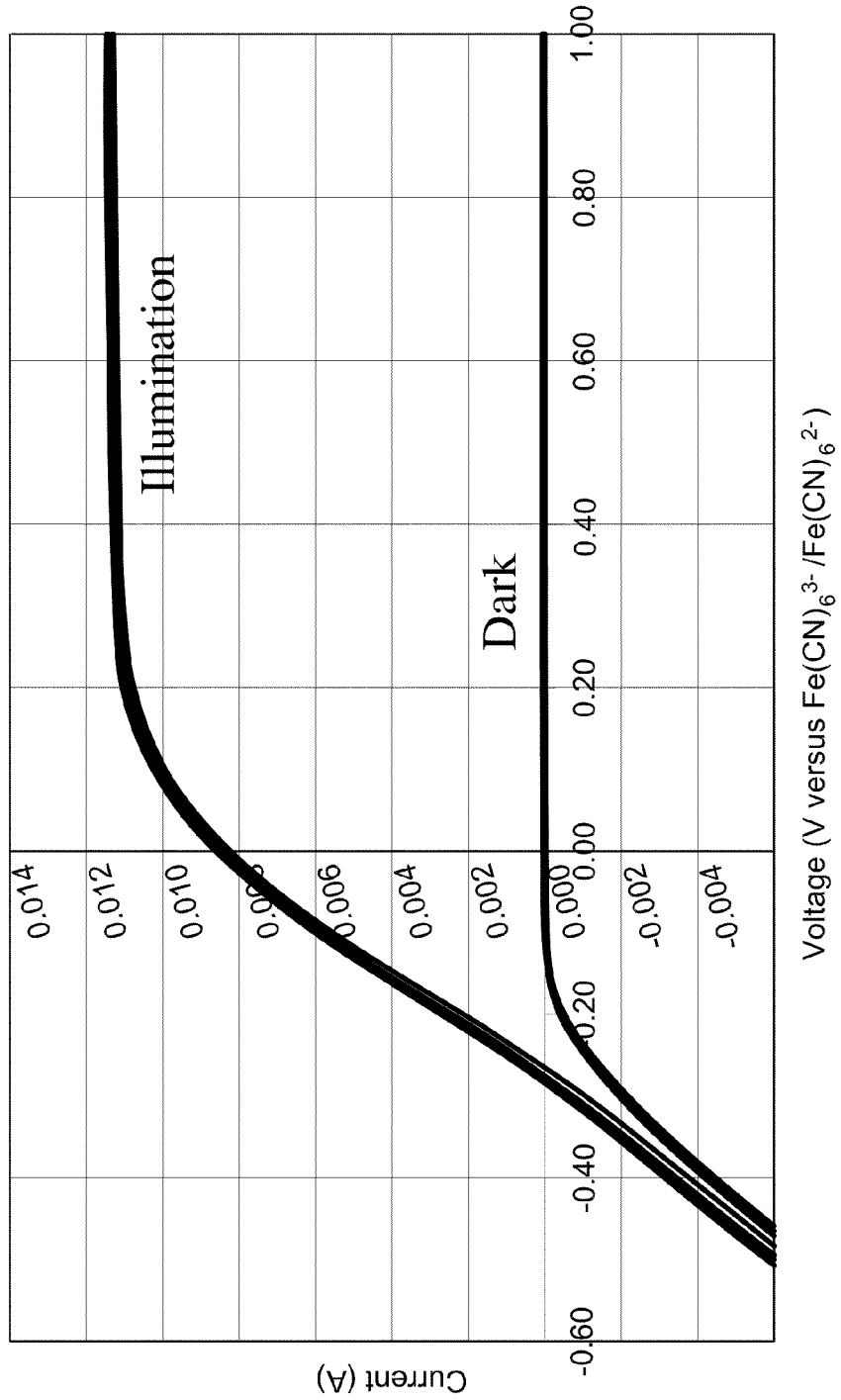

FIG. 12 depicts the electrochemical response of the CNT-functionalized n-type Si electrode. Current-voltage characteristic is depicted in darkness and under white light illumination (2 scans) of CNT-functionalized n-type Si electrode with a dense entangled CNT layer of about 100 nm in an aqueous solution of 0.35M $K_4Fe(CN)_6$, 0.35M $K_3Fe(CN)_6$, and 0.2M KCl in water (pH=6.8), with a Pt mesh counter electrode and Pt wire in a Luggin capillary as shown for the schematic of the 3-electrode setup in FIG. 8a.

Figure 13:
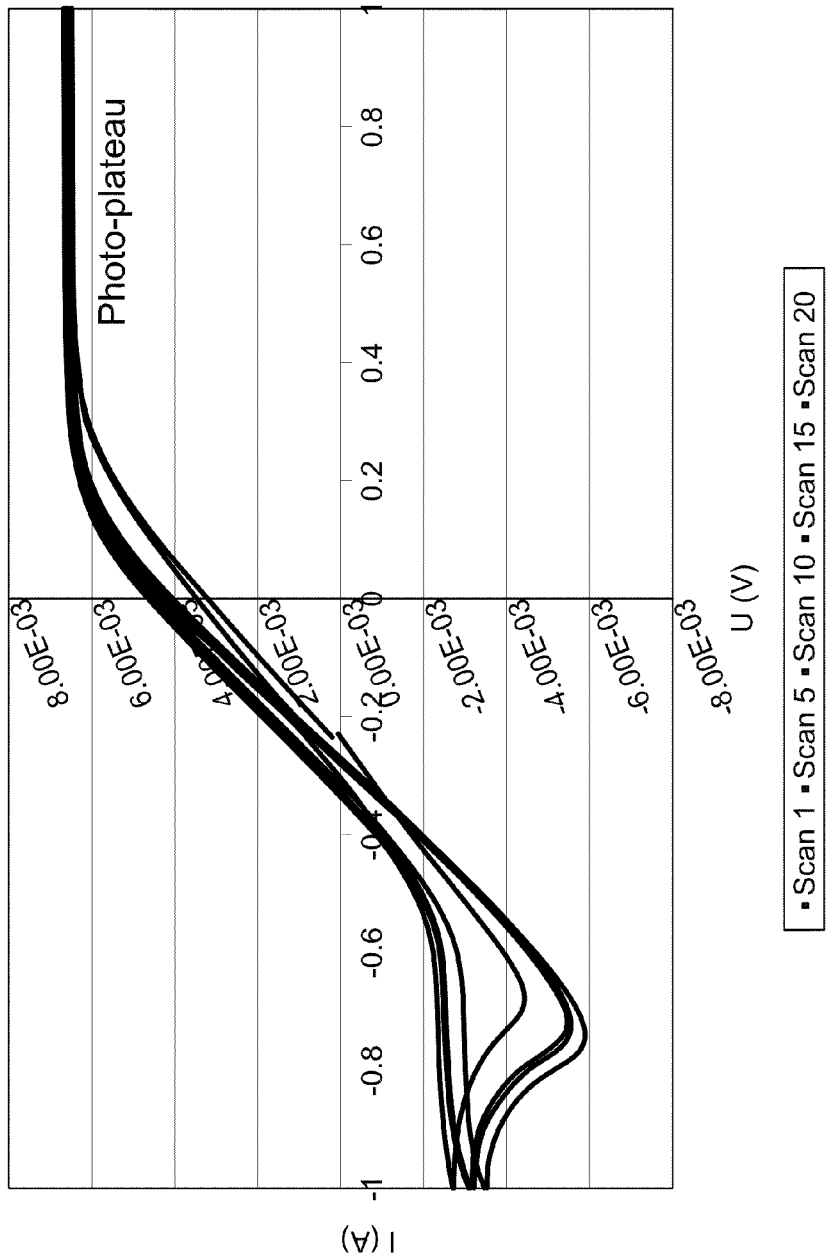

FIG. 13 depicts the stable photo-electrochemical response of CNT-functionalized n-type Si anode in aqueous solution of 0.35M $K_4Fe(CN)_6$, 0.05M $K_3Fe(CN)_6$, 0.2M KCl in water (pH=7.1). Photo-electrochemical response was measured in a 3-electrode setup with Pt-wire placed in Luggin tip as reference and Pt mesh as counter electrode. Twenty scans of the anodic photo-plateau current for the oxidation of $Fe(CN)_6^{4-}$ (0.35M) and cathodic wave for reduction of $Fe(CN)_6^{3-}$ (0.05M) were done.

Figure 14:
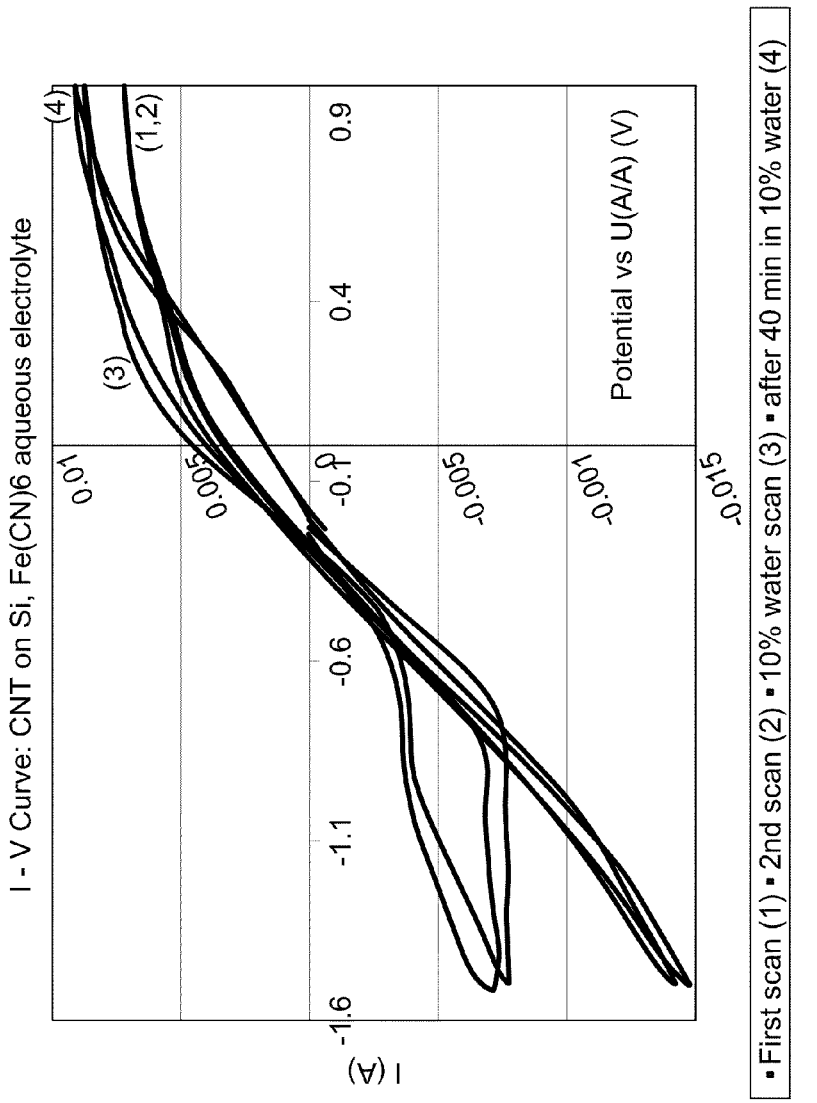

FIG. 14 depicts the stable photo-electrochemical response of CNT-functionalized n-type Si anode in organic media (a non-aqueous solution of 0.125M LiI, 0.025M $I_2$, 0.25M $LiClO_4$ in acetonitrile). Photo-electrochemical response was measured in a 3-electrode setup with Pt-wire placed in Luggin tip as reference and Pt mesh as counter electrode. The first two scans were done in the as-made solution. The next two scans were done with the addition of 10% water.

Figure 15:
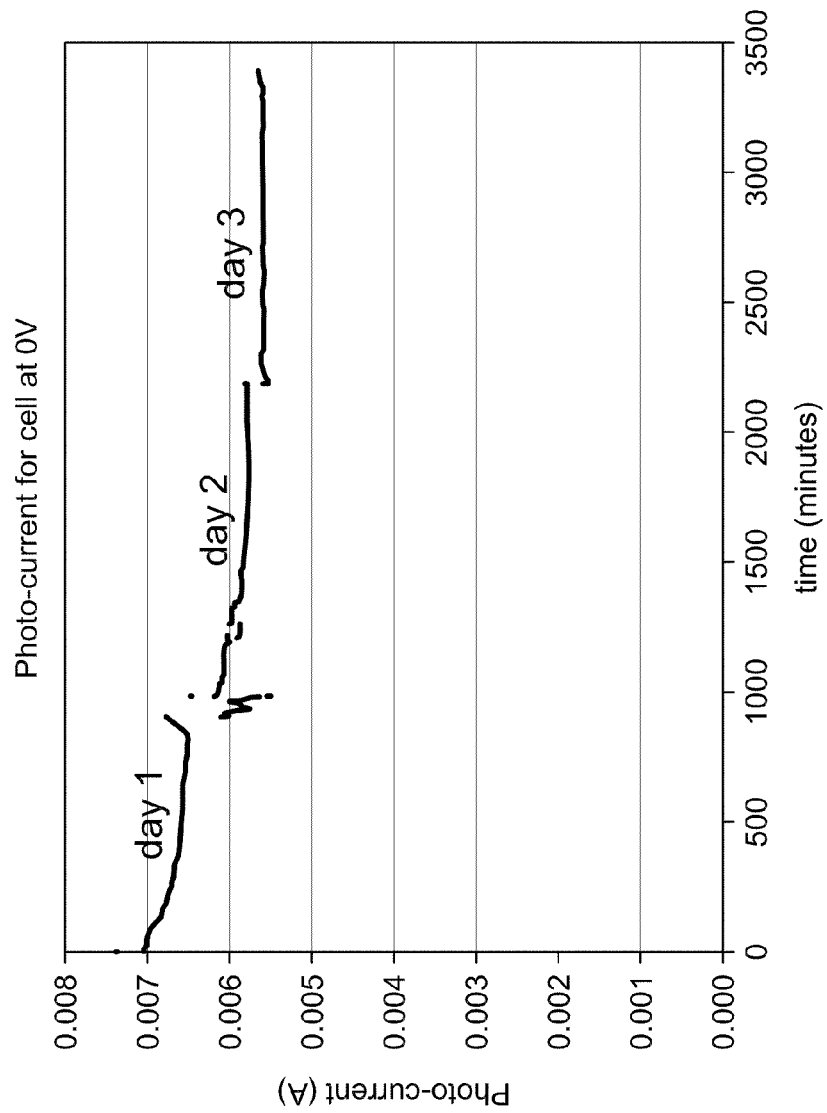

FIG. 15 depicts the long-term stability of Si photo-anode in aqueous medium. Photocurrent-time evolution is shown for a photo-voltaic cell with CNT-functionalized n-type Si photo-anode and ITO glass counter electrode functionalized with Pt particles under white light illumination with an aqueous solution of 0.35M $K_4Fe(CN)_6$, 0.35M $K_3Fe(CN)_6$, and 0.2M KCl in water (pH=6.8) as cell electrolyte. The cell was operated for three days in a row at 0V (short-circuit) for several hours and then left at open-circuit until next illumination.

DETAILED DESCRIPTION OF THE PREFERRED EMBODIMENT

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects.

Furthermore, while some embodiments described herein include some but not other features included in other embodiments, combinations of features of different embodiments are meant to be within the scope of the invention, and form different embodiments, as would be understood by those in the art.

In the description provided herein, numerous specific details are set forth. However, it is understood that embodiments of the invention may be practiced without these specific details. In other instances, well-known methods, structures and techniques have not been shown in detail in order not to obscure an understanding of this description.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

The term CNT refers to carbon nanotubes and one-dimensional carbon nanostructures, including single-walled CNT, multi-walled CNT, carbon nanofibers and nanowhiskers.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

In one aspect, a method is provided for functionalizing a semiconductor surface with CNT whereby carbon nanostructures are formed on the surface of a semiconductor material, for example silicon, to protect the surface from oxidation, passivation and decomposition and/or avoid negative impact of aqueous molecules.

The method for stabilizing the semiconductor surface comprises at least the step of forming carbon nanostructures onto said surface. By using CNT to functionalize the surface: (1) a hydrophobic protection barrier is created to keep the electrolyte and water away from the semiconductor surface; and (2) metallic conduction paths are created through any passivation oxide layer that would be still formed on the surface.

The principle of the method of preferred embodiments is shown in FIG. 5. The CNT are formed on top of the semiconductor as shown in FIG. 5. The CNT can be straight and aligned (FIG. 5a) or twisted and curled (FIG. 5b). The CNT can be densely packed, also referred to as CNT mat or CNT carpet as in FIGS. 5a and 5b. For the dense mat of straight and aligned CNT in FIG. 5a, a high density of CNT is necessary, typically between $10^{10}$ tubes per $cm^2$ and $10^{13}$ tubes per $cm^2$, to create a barrier for solution. For the densely packed CNT of FIG. 5b, the density can be lower ($10^8$-$10^{11}$ tubes per $cm^2$) as the entanglement of the curly CNT creates a barrier to the solution. When the CNT are densely packed, as in FIGS. 5a and 5b, the electrolyte or water cannot penetrate the hydrophobic CNT barrier and thus cannot reach the semiconductor surface so that oxidation with surface passivation (as for Si) or material dissolution (as for Ge and III-V semiconductors) is prevented. For the dense CNT configurations, back-side illumination is preferred as otherwise the incident light intensity is reduced due to the shadowing effect of the CNT layer.

Figure 5A:
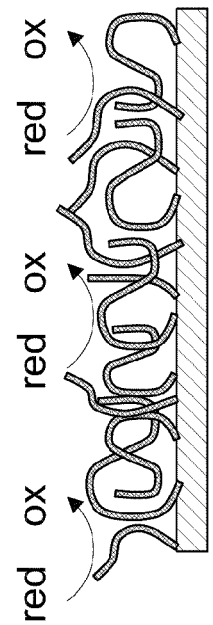
FIG. 5 depicts different structures of CNT functionalized semiconductors according to the preferred embodiments.
Figure 5C:
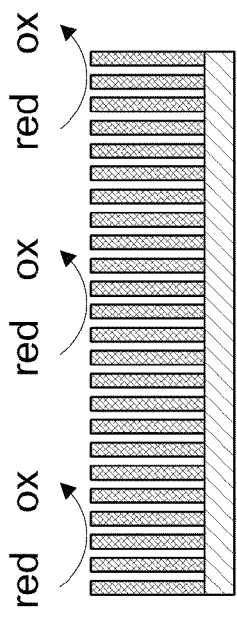
Figure 5B:
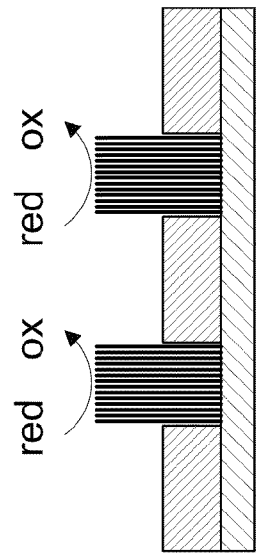
Figure 5D:
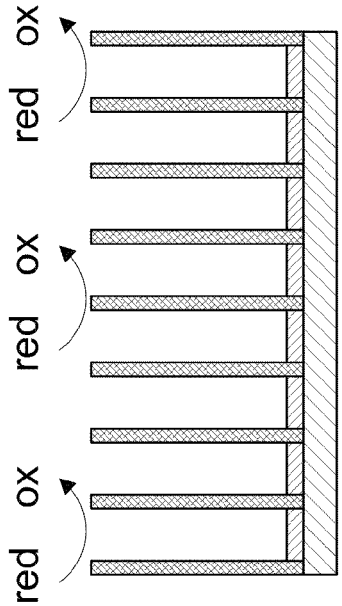

Alternatively, the CNT can be sparse and separated from each other as shown schematically in FIG. 5c. In this case a passivation oxide will form in the semiconductor areas in-between the tubes where no electrochemical reaction can take place. This configuration is not recommended for semiconductors, such as Ge and III-V which are soluble in the solution medium. This configuration can be useful when front-side illumination is preferred as the light can penetrate the semiconductor more easily in the none-functionalized areas. Alternatively, the CNT can also be patterned into patches of CNT as shown in FIG. 5d. FIG. 6 shows an example of a blanket layer of densely entangled CNT and of patterned CNT bundles on n-type Si according to the preferred embodiments and corresponding to the schematics of FIGS. 5b and 5d, respectively.

The working principle of the photo-electrochemical cell with a CNT functionalized n-type semiconductor is shown in FIG. 7. Photons from the incident light generate electron-hole pairs in the semiconductor which are separated by the electric field in the space-charge layer of semiconductor. The holes are driven to the surface of the semiconductor and transferred to the conductive CNT. The electrochemical reaction (oxidation of the reducing agent, Red, in solution transforming it to its oxidized form Ox) now proceeds at the CNT/electrolyte interface. The oxidizing species, Ox, are reduced again at the reversible counter electrode (e.g. Pt or platinized ITO).

The preferred embodiments provide a method for stabilizing semiconductor surfaces such as a silicon (Si) surface, e.g., by functionalizing the surface with carbon nanostructures e.g. carbon nanotubes (CNT).

Even though a focus is on silicon electrodes for electrochemical cells, it is clear that CNT protection can be used for any electrode material that suffers from oxidation. For example, metal electrodes, such as titanium will also form a passivation oxide upon electro-oxidation. Also in this case CNT can be used to protect the surface when needed. The main advantage for a material such as silicon however, is that one can use its photocurrent generating properties, whereas for a titanium electrode, also thin coatings of inert metal such as platinum could be used. The CNT protection is not only against formation of passivation oxides, it can also be used to protect the surface from corrosion or dissolution. For example, photoanodes of III-V semiconductor materials such as GaAs, InAs, GaP, and the like, suffer from electroetching or (photo)anodic dissolution of the electrode Also here CNT can prevent access of electrolyte to the surface and prevent dissolution. As for silicon, also the photocurrent generating properties of these materials can now be exploited in solution.

According to preferred embodiments, the CNT can be further functionalized to improve hydrophobic properties and hence improve the property of CNT to repel aqueous molecules and hence avoid contact of aqueous molecules with the semiconductor substrate.

According to preferred embodiments, the CNT can be further functionalized with chemical groups specific for the sensing of certain target of molecules or ions for detection.

According to preferred embodiments, the method for stabilizing semiconductor surfaces comprises at least the steps of: providing at least one catalyst particle on said surface, and then using said catalyst particle to form carbon nanostructures onto said surface.

The catalyst particles may be, but are not restricted to, nanoparticles, 1 nm to 100 nm in diameter, of nickel, cobalt or iron and mixtures thereof and alloys thereof with W, V, and/or Mo.

According to preferred embodiments, the step of providing at least one catalyst particle on said surface may be performed by electrodeposition.

Electrodeposition is a room temperature technique (between 15 to 80° C.) where the catalyst nanoparticles are formed directly onto the surface through a nucleation and growth process. The advantage of this technique is that no further pretreatment is needed and growth of CNT can be done directly from the as-deposited nanoparticles. This is important as pretreatments include typically heat and/or plasma treatments which may cause diffusion of the metal into the semiconductor and/or solid state reactions such as silicidation reactions with silicon semiconductor with the formation of metal silicides such as NiSi, $Ni_2Si$, $CoSi_2$, etc. Post-deposition treatments also can cause surface oxidation which should be avoided.

Alternatively, the step of providing at least one catalyst particle on said surface may be performed by spin coating or drop casting a colloidal solution of catalyst nanoparticles. Colloidal solutions are suspensions of metallic nanoparticles surrounded by a ligand shell of strongly adsorbing organic molecules with such as molecules with carboxylic acid group at the end. The molecules can be chosen of different length such as citric acid as a short molecule or oleic acid as a longer molecule, which will then define the size of the ligand shell and thus the size of the colloidal particle. As for electrodeposition, this technique provides the catalyst directly in the form of nanoparticles on the surface. However, a thermal and/or plasma pretreatment step is necessary to remove the organic molecules of the ligand shell.

Alternatively, the step of providing at least one catalyst particle on said surface may be performed by spin coating or drop casting a solution containing a salt with the metal ions of interest (e.g. chloride, sulfate, nitrate, citrate, perchlorate salts of Ni, Co and Fe and mixtures thereof). In this case a layer of the metal salt is obtained after drying out the solvent, e.g. water. The particles are formed post-deposition by a so-called sintering step preferably in a reducing atmosphere, e.g. forming gas at high temperatures (600-900° C.). This high-temperature sintering step may cause diffusion of metal into the semiconductor or reaction, the severity of which depends on the duration of the heat treatment step, and should preferably be less than 1 minute.

Alternatively, the step of providing at least one catalyst particle on said surface may be performed by thin film deposition techniques such as physical vapor deposition (PVD, thermal and sputter deposition), atomic layer deposition (ALD) or chemical vapor deposition (CVD). First, a thin layer of metal(s) is deposited onto said surface; preferably the thickness of said layer is less than 10 nm, more preferably between 1 and 5 nm. Subsequently, a post-deposition treatment is done where the thin layer of metal(s) is annealed to break up the film into nanoparticles, also known as film agglomeration. To control the size (diameter) of said nanoparticles the temperature and time of the annealing step are critical as well as the thickness of the metal film. The film agglomeration can be assisted by plasma enhancement or by supporting gasses such as ammonia ($NH_3$). The optimal temperature and time to create said metal containing nanoparticles is dependent on the type of metal, the thickness of the deposited metal layer and the substrate onto which the nanoparticles need to be formed. Preferred temperature ranges for annealing are between 500° C. and 800° C. which can be further optimized. Gases such as nitrogen, argon, helium and/or hydrogen can be used as ambient gases in the reactor for anneal.

According to preferred embodiments, the step of forming (growing) CNT (carbon nanostructures) from said metal nanoparticles is preferably done using growth techniques such as Chemical Vapor Deposition (CVD). The method used to grow the carbon nanostructures is preferably using a carbon gas source such as methane ($CH_4$), ethylene ($C_2H_4$) or acetylene ($C_2H_2$) and additionally gasses such as $N_2$, He, Ar, $NH_3$ and/or $H_2$ may be added as assistant gases. The metal nanoparticles catalyze the nucleation and growth of the carbon nanostructures, The growth temperature is preferably in the range of 400° C. up to 900° C., temperatures higher than 900° C. need however to be avoided. The optimal growth temperature is dependent on the nature of the catalyst nanoparticles; the growth temperature is preferably limited to 600° C. to avoid diffusion of the metal into the substrate.

The above and other characteristics, features and advantages of the present invention will become apparent from the following detailed description of examples, taken in conjunction with the accompanying drawings, which illustrate, by way of example, the principles of the invention.

The fabrication of the CNT-functionalized semiconductor electrode and the assembly of a photo-electrochemical cell will be described in detail. As an example, n-type silicon is used and the methods are preferred embodiments.

As substrate, a moderately doped semiconductor substrate is preferably used, as the doping of the semiconductor bulk and surface should be such that a good Schottky contact with the solution and CNT is obtained and can range from $10^{14}$-$10^{18}$ $cm^{-3}$, depending on the substrate material. For silicon, a doping between $10^{14}$ and $10^{16}$ $cm^{-3}$ is recommended. For a III-V semiconductor such as GaAs, the doping can range between $10^{16}$ and $10^{18}$ $cm^{-3}$. In the examples of photoelectrochemical cells given below an n-type silicon wafer with doping level of $5 \times 10^{14}$ $cm^{-3}$ was used.

An ohmic contact is made to the back-side of the semiconductor wafer. For the moderately doped Si substrate in the examples, the doping level (conductivity) of the back side was increased to about $10^{20}$ $cm^{-3}$ by As implantation, a standard doping technique in semiconductor processing. For Si substrates As, P, or Sb can be used for n-type doping and B, Al and In can be used for p-type. Alternatively, also dopant in-diffusion, for example from phosphorous-doped (n-type) or boron-doped (for p-type) spin-on glass can be used for creating a highly doped back side on n-type Si. For electrical contacting, a metallic contact is made to the back-side of the wafer. This can be done by deposition of a metal layer such as Al, Ti or TiN on the wafer surface. To improve contact resistance for electrical contact with Si substrates, a low resistance silicide phase such as NiSi, $CoSi_2$ or $TiSi_2$ can be formed prior to making the metal contact or layer by rapid-thermal anneal process of the Si with Ni, Co or Ti. To allow openings for back-side illumination a grid-like pattern can be made for example by screen-printing as currently done for photovoltaic cells. For the demonstration of our photo-electrochemical cell with a three-electrode setup, an aluminum plate was pressed against the highly doped back-side. To allow back-side illumination, holes were present in the aluminum plate. For the demonstration of our photoelectrochemical cell with a two-electrode configuration, indium-gallium eutectic was applied around the borders of the back-side surface and a copper foil with a hole in the center was clamped onto the backside. Both, the three-electrode setup and two-electrode setup used are shown in FIG. 8.

Nickel was used as metal of choice for the catalyst nanoparticles. Electrodeposition was used as the method of choice for deposition. The same three-electrode setup of FIG. 8 was used for the electrodeposition, except for an Ag/AgCl/3M NaCl reference electrode instead of the platinum wire. Electrodeposition can be done in potentiostatic mode (constant applied voltage) or galvanostatic mode (constant applied current). The density of the nickel particles is determined by the steady-state current density. For galvanostatic mode, the steady-state current density is equal to the applied current density (current divided by electrode area). For potentiostatic mode, the steady-state current density is the constant current density (current divided by surface area) obtained shortly after the (0.1-0.4 s) after applying the potential. The steady-state current density as a measure rather than the applied potential as this varies upon the setup and reference electrode used, and also applies to those cases where no reference electrode is available (2-electrode setup). The solution for nickel deposition used was an aqueous solution with 0.01M Ni $(NO_3)_2$, 1M NaCl and 1M $NH_4Cl$ and the pH was adjusted to 8.3 with $NH_4OH$. Alternative, any nickel plating bath known in the art of electroplating can be used [e.g. "Modern Electroplating, Edited by Mordfechay Schlesinger and Milan Paunoviv, John Wiley & Sons, INC.]. The Ni particle density for n-type Si substrate in the said solution can be tailored by the steady-state current density as shown in FIG. 9. In FIG. 10a an example is shown of Ni catalyst nanoparticles obtained after electrodeposition in potentiostatic mode for 0.6 s at −2.31V versus the Ag/AgCl/3M NaCl reference electrode in the 3-electrode setup of FIG. 8. The steady state current density was about 60 mA/cm$^2$ and a particle density of $1.6 \times 10^{10}$ Ni nanoparticles per cm$^2$ was obtained. The average size of the Ni nanoparticles was 20 nm. The size of the nanoparticles is a function of time, and larger particles will be obtained for larger deposition times.

Next, CNT were grown from the electrodeposited Ni particles by catalytic chemical vapor (CVD) deposition.

Said CVD growth can be done in tube furnace with horizontal gas flow over the samples at atmospheric pressure. Growth has been done successfully with acetylene ($C_2H_2$), ethylene ($C_2H_4$) and methane ($CH_4$) gas as carbon gas source. Typical gas flows were 10 to 30 ml per liter for $C_2H_2$, 100-500 ml per liter for $C_2H_4$, or 1 liter per minute for $CH_4$. Supporting gasses were $N_2$ and/or $H_2$ with typical gas flows of 0 or 800 to 1500 ml per minute for $N_2$ and 200 to 3000 ml per minute for $H_2$. Alternatively, also other gasses can be used as known in the art. The growth temperature was set between 500° C. and 900° C. Growth can be done with or without anneal as pretreatment. Preferably, the pre-growth anneal has to be kept short, preferably below 5 minutes.

FIG. 10b shows a top-view SEM image of a dense CNT layer grown according to the preferred embodiments from dense Ni particles as those in FIG. 10a. The thickness of the CNT layer depends on growth conditions and on growth time. Dense CNT layers from a few tens of nanometer in thickness up to several micrometers can be grown. FIG. 11 shows cross-sectional images of dense CNT layers grown according to preferred embodiments with thick layer of entangled CNT (6-7 micron in FIG. 11a) and a thin layer of entangled CNT (250 nm in FIG. 11b).

The SEM image of FIG. 6a shows entangled carbon nanotubes grown from electrochemically deposited Ni particles on blanket n-type Si-semiconductor substrate (−1.5V vs. Ag/AgCl for 2 s in clamp-on tube cell with area of 1.4 cm$^2$, the steady-state current density of this experiment was 100 mA/cm$^2$ corresponding to a nickel particle density of $8 \times 10^{10}$ cm$^{-2}$) in a thermal CVD reactor. FIG. 6(b) shows an SEM image (45° tilt) of CNT grown selectively out of 300 nm patterned holes in 300 nm thick SiO$_2$ on the Si substrate from electrodeposited Ni nanoparticles (galvanostatic mode: −100 mA cm$^{-2}$ for 0.2 s, the area of the exposed Si only was used to estimated current density). The tubes are approximately 20 nm in diameter. CNT growth was carried out in a catalytic chemical-vapor deposition (CCVD) horizontal-flow reactor using $C_2H_4$ as the carbon source at atmospheric pressure. The substrates were first heated to 700° C. in a $N_2$ atmosphere (1 litre per minute $N_2$ flow) for 3 minutes and then CNT growth was started by the introduction of a mixture of $H_2/C_2H_4$. Specifically, blanket substrates as that of FIG. 6(a) were exposed to a mixture of $H_2/C_2H_4$ (flow ratio of 500/100 ml per minute) for 5 minutes. Whereas, CNT growth on patterned substrates, as that of FIG. 6(b), was achieved using a flow of 500/500 ml per minute for 1 minute.

After growth, the CNT-functionalized Si electrodes were incorporated into photo-electrochemical cells to test the photo-electrochemical response and stability of the CNT-functionalized semiconductor electrodes.

Figure 3:
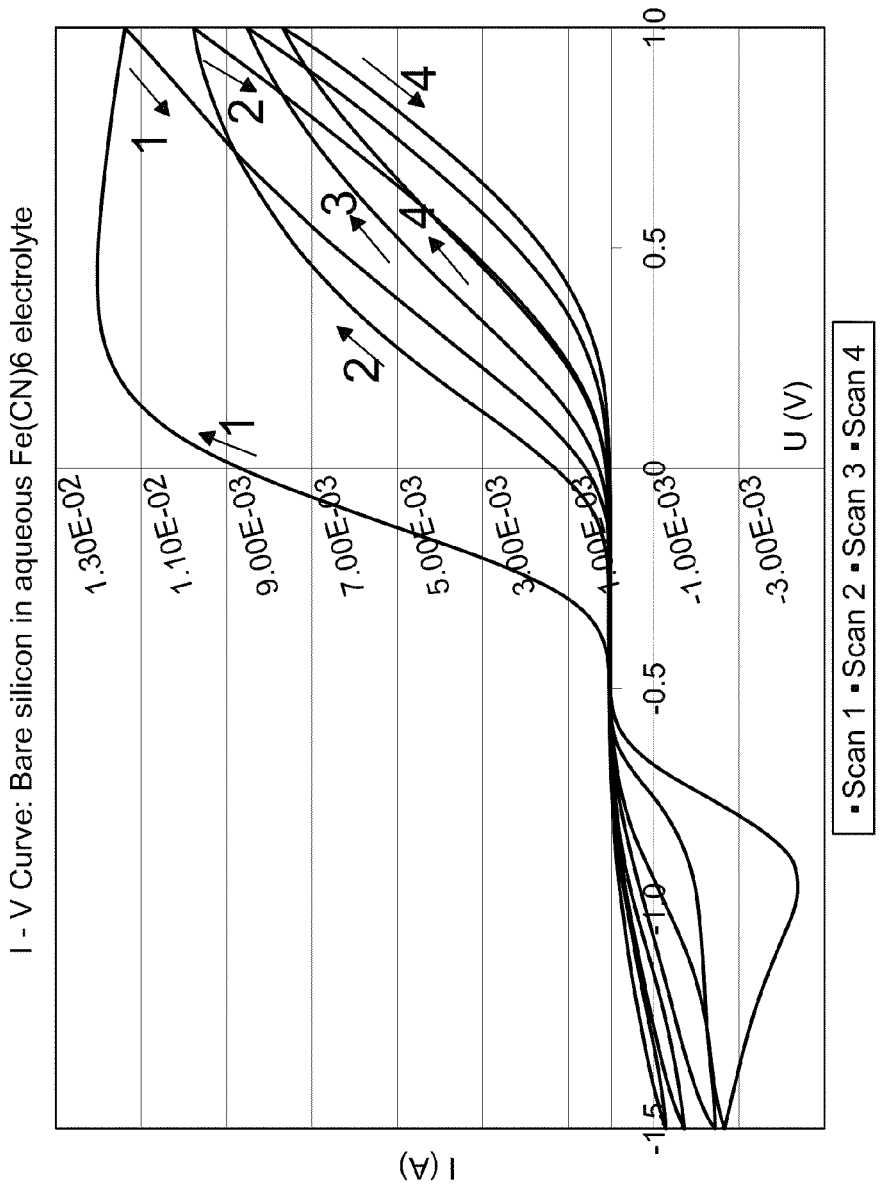
Figures 8A, 8B:
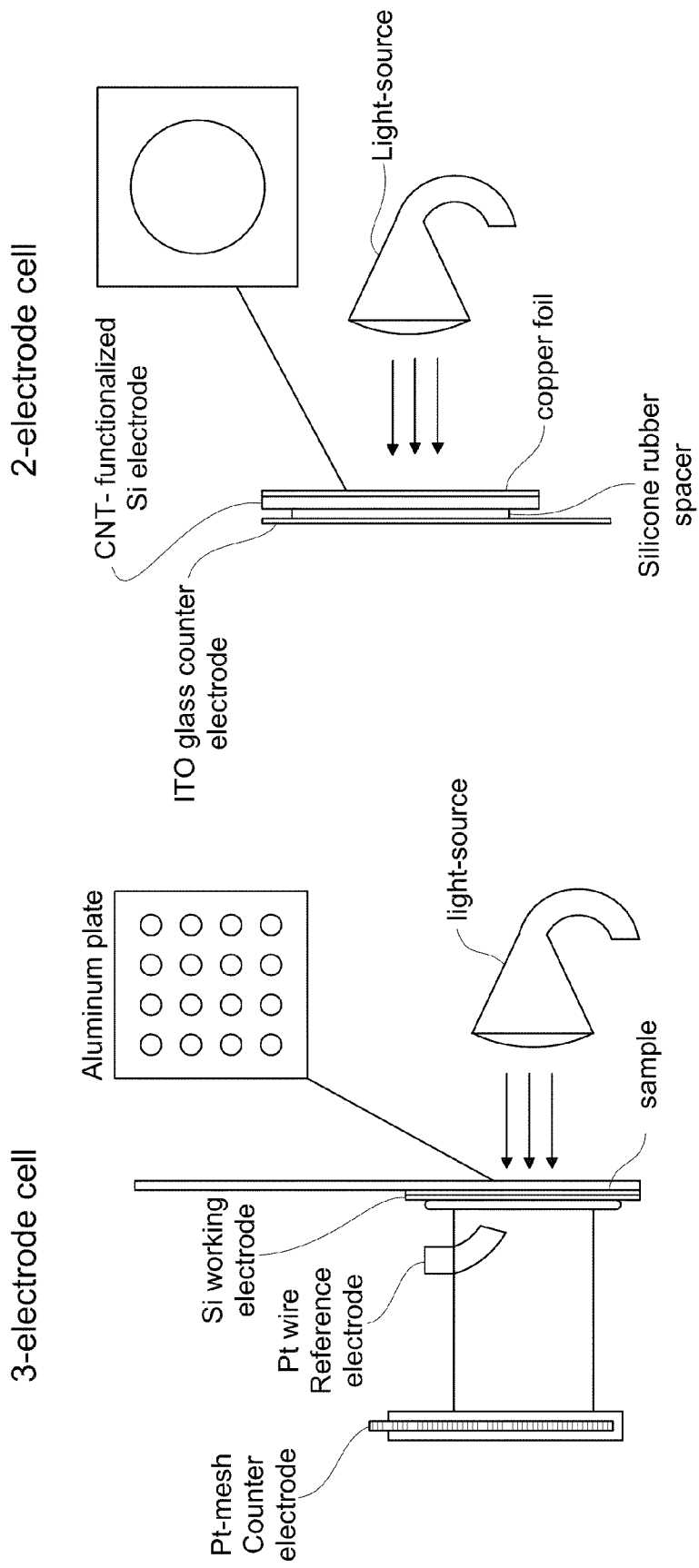

The CNT-functionalized n-type Si semiconductor electrode was incorporated into a three-electrode setup as that shown in FIG. 8a with a pt wire placed in a Luggin capillary tip as a reference electrode and a Pt mesh as counter electrode. The electrochemical response of a CNT-functionalized n-type Si electrode with a dense entangled CNT layer of about 100 nm in an aqueous solution of 0.35M $K_4Fe(CN)_6$, 0.35M $K_3Fe(CN)_6$, and 0.2M KCl in water (pH=6.8) is shown in FIG. 12. The potential of the Pt reference electrode was the equilibrium potential of the $Fe(CN)_6^{3-}/Fe(CN)_6^{2-}$ and is 0.36V versus the standard hydrogen electrode (SHE). In darkness, no anodic current is measured as the n-type Si/CNT/electrolyte interphase produces a Schottky diode as necessary for photoelectrochemical cells. Under white light illumination, an photo-current is measured with a stable photo-current plateau of about 10 mA. Two subsequent scans are shown in the Figure which overlay and demonstrate already the improved surface stability of the Si as compared with of the bare n-type Si photo-anode in FIG. 3.

The stability of the CNT-functionalized n-type Si electrode in aqueous environment is demonstrated for the $Fe(CN)_6^{3-}/Fe(CN)_6^{4-}$ redox couple in FIG. 13 which shows the current-voltage (I-V) curves under white light illumination for up to 20 scans. The electrochemical response is stable up to 20 scans.

Figure 4:
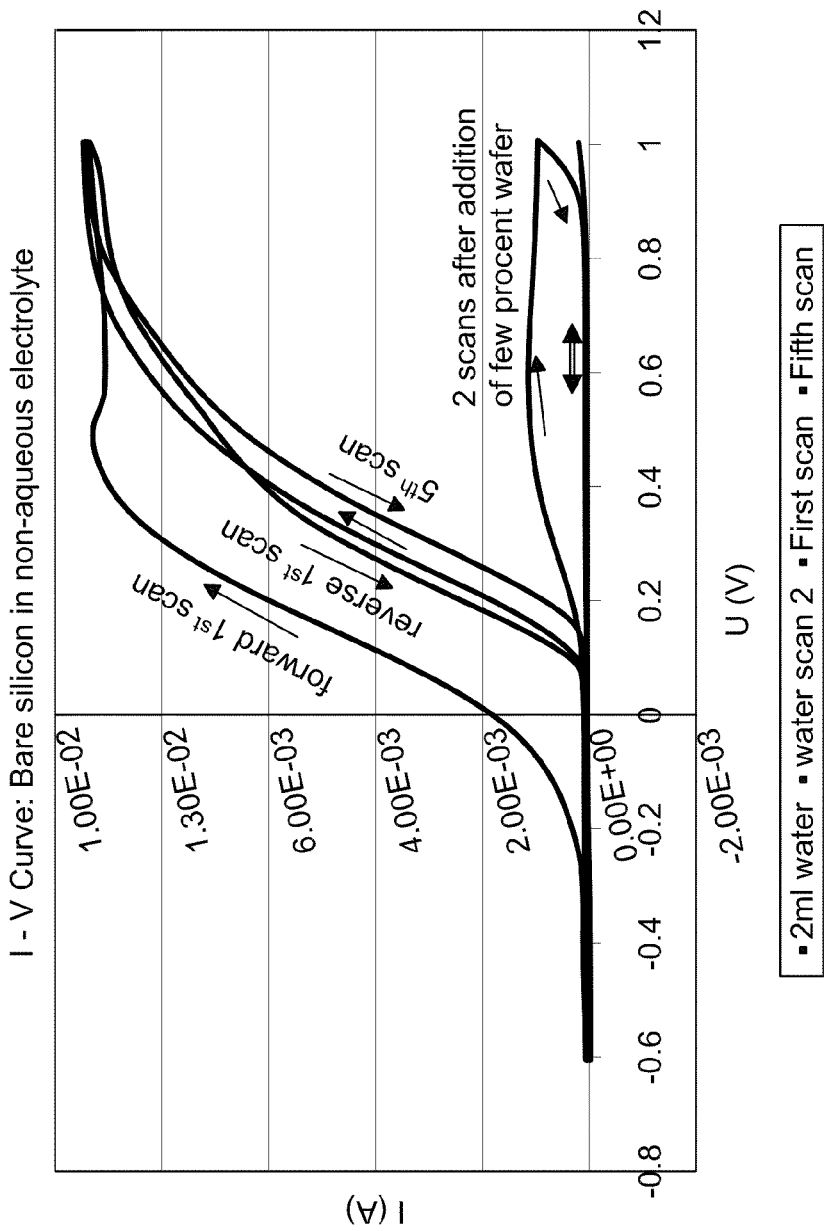
FIG. 4 depicts the photo-electrochemical response at n-type Si semiconductor electrode in organic medium.

The stability of the CNT-functionalized n-type Si electrode in non-aqueous solution is shown in FIG. 14, showing the photo-electrochemical response of CNT-functionalized n-type silicon electrode in a non-aqueous solution of 0.125M LiCl, 0.025M $I_2$, 0.25M $LiClO_4$ in acetonitrile measured in a 3-electrode setup with Pt-wire placed in Luggin tip as reference and Pt mesh as counter electrode. The first two scans were done in the as-made up acetonitrile solution. As no efforts were done to dry the acetonitrile the solutions will contain some wafer but the I-V curves remain stable upon scanning. Upon the addition of 10% water, the I-V remains stable, even when left for more than 12 hours in the cell. Addition of water seems to improve the characteristics somewhat as compared to without water, due to the fact that the dilution made the solution more transparent for light. When compared with the bare Si electrode in FIG. 4, where the surface was passivated almost immediately after addition of the wafer, the cell with the CNT-functionalized electrode remained operational.

To test the long-time stability of the CNT-functionalized electrode, a two-electrode cell was built as shown in FIG. 8b. As counter electrode conductive ITO glass was used which was functionalized with Pt particles by applying platisol (Solaronix SA), a colloidal transparent paint of platinum particles on the ITO followed by sintering at 400° C. for 5 minutes. Around the border of the substrate back-side In—Ga eutectic was applied and was clamped together with a copper foil with large hole in the center and a silicon rubber spacer with the ITO glass. A solution of 0.35M $K_4Fe(CN)_6$, 0.35M $K_3Fe(CN)_6$, and 0.2M KCl in water (pH=6.8) was injected in the space between the CNT-functionalized Si photo-anode and the Pt-functionalized ITO counter electrode. Both electrodes were shorted and the current was measured for several hours over three days interrupted by periods at open-circuit. The current remained stable after three days of (interrupted) operation as shown in FIG. 15. The slight decrease in current was due to evaporation of the electrolyte leaving air bubbles blocking the surface and have nothing to do with stability of the surface. Another cell with solutions of 0.35M $K_4Fe(CN)_6$, 0.05M $K_3Fe(CN)_6$, and 0.2M KCl in water (pH=7) was tested for 5 days and was still stable after that time.

The photovoltaic properties of this cell were measured in a solar simulator given a photo-voltage of about 0.3V and a photo-current of 3 mA/cm². As the series resistance of this cell was not yet optimized the performance of the cell was rather poor with a fill factor of 23% and an efficiency of only 0.2%. These values can be improved upon considerably by improving contact and solution resistances and well as managing the light absorption efficiency of the cell. These results were given as a demonstration of the stability of such CNT-functionalized electrodes which can be used in photo-electrochemical cells for detection, sensing and low-cost solar energy conversion.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized preferred embodiments. Accordingly, the appended claims are intended to include within their scope such processes, machines, manufacture, compositions of matter, means, methods, or steps.

What is claimed is:

1. A method for manufacturing a stable electrode for a photoelectrochemical cell, the method comprising:
providing a semiconductor layer, wherein the semiconductor layer is configured to function as an electrode of a photoelectrochemical cell, wherein the semiconductor layer comprises an unstable semiconductor material subject to at least one of oxidation, passivation, or decomposition when exposed to a wet environment;
providing catalyst particles on a surface of the semiconductor layer that is free from oxidation, passivation, and decomposition; and thereafter
using the catalyst particles to grow a dense mat of carbon nanotubes directly on the surface, wherein the dense mat of carbon nanotubes forms a hydrophobic protection barrier on the surface, wherein the hydrophobic protection barrier is configured to keep electrolyte and water away from the surface so as to avoid oxidation, passivation or decomposition of the semiconductor layer beneath the carbon nanotubes of the dense mat, whereby a stable electrode for a photoelectrochemical cell is obtained, wherein the stable electrode comprises the semiconductor layer and the dense mat of carbon nanotubes, and wherein the dense mat of carbon nanotubes is selected from the group consisting of a dense mat of straight and aligned carbon nanotubes having a density on the surface of from about $10^{10}$ tubes per cm² to about $10^{13}$ tubes per cm² and a dense mat of curled and twisted carbon nanotubes having a density on the surface of from about $10^8$ tubes per cm² to about $10^{11}$ tubes per cm².

2. The method of claim 1, wherein the catalyst particles are provided by chemical vapor deposition.

3. The method of claim 1, wherein the catalyst particles are grown using a growth technique using a carbon gas source.

4. The method of claim 3, wherein the carbon gas source is $C_2H_4$ and wherein the growth technique uses at least one of an $H_2$ assistant gas and an $N_2$ assistant gas.

5. The method of claim 1, wherein the photoelectrochemical cell is a photoelectrochemical sensor.

6. The method of claim 1, wherein the photoelectrochemical cell is a photoelectrochemical solar cell.

7. The method of claim 1, wherein the semiconductor surface is photoelectrochemical cell is a photoelectrochemical detector.

8. The method of claim 1, wherein the photoelectrochemical cell is configured for photoelectrochemical synthesis.

9. The method of claim 1, wherein the carbon nanostructures are from about 1 nm to 100 nm in diameter, and wherein the catalyst particles comprise at least one metal selected from the group consisting of nickel, cobalt, iron, mixtures thereof, and alloys thereof with at least one metal selected from the group consisting of tungsten, vanadium, and molybdenum.

10. The method of claim 1, wherein the photoelectrochemical device is configured for back-side illumination of the dense mat.

11. The method of claim 1, wherein the semiconductor layer comprises silicon, and wherein the hydrophobic protection barrier prevents oxidation of the silicon and passivation of the surface of the semiconductor layer.

12. The method of claim 1, wherein the semiconductor layer comprises at least one material selected from the group consisting of germanium and III-V semiconductors, and wherein the hydrophobic protection barrier prevents dissolution of the material.

13. The method of claim 1, wherein the step of providing catalyst particles on a semiconductor surface comprises:
depositing a metal layer onto a semiconductor surface by chemical vapor deposition, wherein the metal layer has a thickness of less than 10 nm; and
annealing the metal layer at a temperature of from 500° C. to 800° C., wherein annealing is conducted in an ambient gas selected from the group consisting of nitrogen, argon, helium, hydrogen, and mixtures thereof, whereby the layer is broken up into nanoparticles by a process of film agglomeration.

14. The method of claim 1, wherein the film agglomeration is assisted by plasma enhancement or by ammonia as a supporting gas.

15. The method of claim 1, wherein a growth temperature for the carbon nanostructures is from 400° C. to 900° C.

16. The method of claim 1, wherein a growth temperature for the carbon nanostructures is limited to 600° C.

17. The method of claim 1, wherein the semiconductor substrate is silicon doped to from $10^{14}$ cm$^{-3}$ to $10^{18}$ cm$^{-3}$.

18. The method of claim 1, wherein the semiconductor substrate is GaAs doped to from $10^{16}$ cm$^{-3}$ to $10^{18}$ cm$^{-3}$.

19. The method of claim 1, wherein the semiconductor surface is an n-type silicon wafer with a doping level of $5\times10^{14}$ cm$^{-3}$ and configured for use as a stable electrode for a photoelectrochemical cell, the method further comprising making an ohmic contact to a back-side of the n-type silicon wafer, wherein the back-side of the semiconductor wafer is doped to about $10^{20}$ cm$^{-3}$ by As implantation.

20. The method of claim 19, wherein the ohmic contact is a metallic contact made to the back-side of the n-type silicon wafer by deposition of a layer selected from the group consisting of Al, Ti and TiN.

21. The method of claim 20, wherein a low resistance silicide phase selected from the group consisting of NiSi, CoSi$_2$, and TiSi$_2$ is formed prior to making the metallic contact.

22. The method of claim 21, wherein the low resistance silicide phase is formed by a rapid-thermal anneal process after deposition of Ni, Co or Ti.

23. The method of claim 20, wherein the metallic contact is in a grid-like pattern made by screen-printing, whereby openings for back-side illumination of the photovoltaic cell is provided.

24. The method of claim 1, wherein the carbon nanostructures are carbon nanotubes grown from Ni particles by catalytic chemical vapor deposition in a tube furnace with horizontal gas flow over the semiconductor surface at atmospheric pressure.

25. The method of claim 24, wherein the gas consists of 10 to 30 ml C$_2$H$_2$ per liter gas in one or more supporting gases selected from the group consisting of N$_2$ and H$_2$.

26. The method of claim 24, wherein the gas consists of 100 to 500 ml C$_2$H$_4$ per liter gas in one or more supporting gases selected from the group consisting of N$_2$ and H$_2$.

27. The method of claim 24, wherein the horizontal gas flow consists of 1 liter per minute CH$_4$ in one or more supporting gas flows selected from the group consisting of N$_2$ at a flow rate of from 800 to 1500 ml per minute and H$_2$ at a flow rate of from 200 to 3000 ml per minute.

28. The method of claim 24, wherein the carbon nanotubes are grown at a temperature of from 500° C. and 900° C.

29. The method of claim 24, wherein the carbon nanotubes are grown without anneal as pretreatment.

30. The method of claim 24, wherein the carbon nanotubes are grown after an anneal of the semiconductor surface, wherein the anneal is of less than 5 minutes in duration.

31. The method of claim 24, wherein the carbon nanotubes are grown after an anneal of the semiconductor surface, wherein the anneal is conducted at a temperature of 700° C. in a N$_2$ atmosphere for 3 minutes.

32. The method of claim 24, wherein the carbon nanotubes are selectively grown out of one or more patterned holes in the semiconductor substrate.

33. The method of claim 24, wherein the carbon nanotubes are selectively grown on a patterned semiconductor substrate.

34. The method of claim 24, wherein the photochemical cell is a wet electrochemical cell.

35. The method of claim 1, wherein the stable electrode is an n-type semiconductor photo-anode.

36. The method of claim 1, wherein the stable electrode is a p-type semiconductor photo-cathode.

37. The method of claim 1, wherein the stable electrode is an electrochemical Schottky diode.

38. The method of claim 1, wherein the semiconductor layer comprises silicon, wherein the catalyst particles comprises at least one metal selected from the group consisting of nickel, cobalt, and titanium, wherein using the catalyst particles to grow a dense mat of carbon nanotubes directly on the surface occurs in at least one of an absence of diffusion of the metal into the semiconductor layer or in an absence of formation of a metal silicide.

* * * * *

UNITED STATES PATENT AND TRADEMARK OFFICE
CERTIFICATE OF CORRECTION

PATENT NO. : 8,148,188 B2  
APPLICATION NO. : 12/392831  
DATED : April 3, 2012  
INVENTOR(S) : Vereecken et al.

Page 1 of 1

Figure 1:
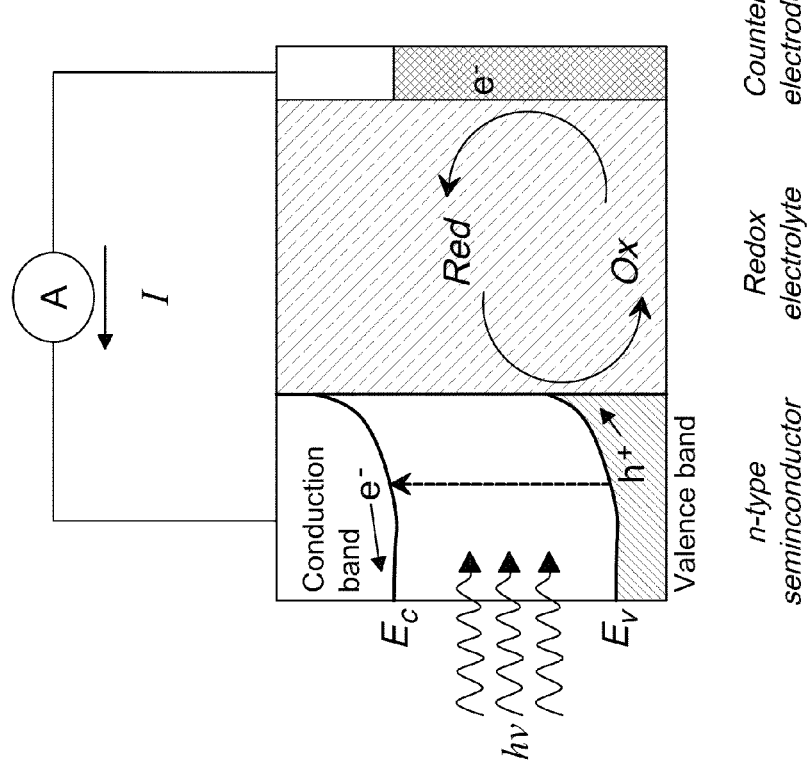
Figure 2:
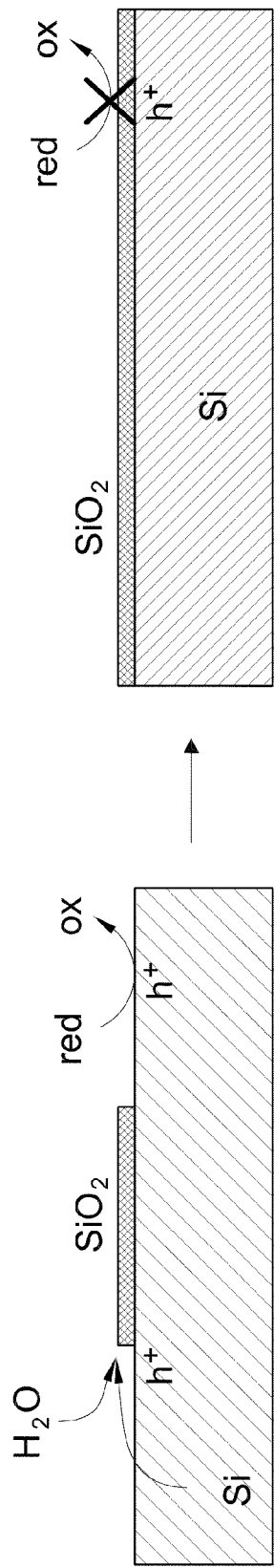

It is certified that error appears in the above-identified patent and that said Letters Patent is hereby corrected as shown below:

| Issued Patent | | Description of Discrepancy |
|---|---|---|
| Column | Line | |
| Page 1 (Item 56) Col. 2 | 24-26 | Under Other Publications, delete "Chiodarelli et al., "Integratin of Vertical Carbon Nanotube Bundles for Interconnects," Journal of the Electrochemical Society, 157 (10) K211-K217 (2010)." and insert the same below "(1993).", as a new Entry. |
| Page 1 Col. 2 | 1 | Change "Savitr" to --Savitri--. |
| Sheet 1 of 15 (FIG. 1) | 11 (Approx.) | Change "seminconductor" to --semiconductor--. |
| Sheet 7 of 15 (FIG. 7) | 12 (Approx.) | Change seminconductor to --semiconductor--. |
| Sheet 8 of 15 (FIGS. 8A-8B) | 1 | Change "photoelectochemical" to --photoelectrochemical--. |
| 6 | 12 | Change "main" to --again--. |
| 10 | 28 | Change "nanostructures," to --nanostructures.--. |
| 12 | 17-18 | Change "100mA cm$^{-2}$" to --100mA·cm$^{-2}$--. |
| 13 | 15 | Change "platisol" to --plastisol--. |
| 14 | 63-64 | In Claim 7, after "the" delete "semiconductor surface". |

Signed and Sealed this  
Thirty-first Day of July, 2012

David J. Kappos  
*Director of the United States Patent and Trademark Office*